United States Patent
Wang et al.

(10) Patent No.: US 9,034,468 B2
(45) Date of Patent: May 19, 2015

(54) DIAMOND-LIKE CARBON

(75) Inventors: Yun-hai Wang, Xi'an (CN); Qing-yun Chen, Xi'an (CN); Xiang-lin Li, Xi'an (CN); Jing-lian Zhao, Xi'an (CN)

(73) Assignee: XI'AN JIAOTONG UNIVERSITY, Shanxi (CN)

( * ) Notice: Subject to any disclaimer, the term of this patent is extended or adjusted under 35 U.S.C. 154(b) by 91 days.

(21) Appl. No.: 13/884,603

(22) PCT Filed: Nov. 29, 2011

(86) PCT No.: PCT/CN2011/083138
§ 371 (c)(1),
(2), (4) Date: May 9, 2013

(87) PCT Pub. No.: WO2013/078612
PCT Pub. Date: Jun. 6, 2013

(65) Prior Publication Data
US 2014/0141251 A1    May 22, 2014

(51) Int. Cl.
*C23C 16/26* (2006.01)
*C01B 31/06* (2006.01)
*H01J 37/32* (2006.01)
*C01B 31/00* (2006.01)

(52) U.S. Cl.
CPC ............... *C01B 31/06* (2013.01); *Y10T 428/30* (2015.01); *H01J 37/32522* (2013.01); *C01B 31/00* (2013.01)

(58) Field of Classification Search
CPC .................................. C01B 31/00; C01B 31/06
USPC ........................... 427/577; 428/408; 423/446
See application file for complete search history.

(56) References Cited

U.S. PATENT DOCUMENTS

| | | | | |
|---|---|---|---|---|
| 5,169,452 A | * | 12/1992 | Nakayama et al. | 427/577 |
| 5,256,854 A | * | 10/1993 | Bromberg et al. | 219/121.52 |
| 5,531,184 A | | 7/1996 | Muranaka et al. | |
| 5,705,272 A | * | 1/1998 | Taniguchi | 428/408 |
| 6,156,667 A | * | 12/2000 | Jewett | 438/715 |
| 7,270,707 B2 | * | 9/2007 | Chen et al. | 117/85 |
| 8,192,820 B2 | * | 6/2012 | Asplund et al. | 428/64.1 |
| 2011/0162958 A1 | * | 7/2011 | Cho et al. | 204/173 |

FOREIGN PATENT DOCUMENTS

| | | |
|---|---|---|
| DE | 10064096 | 12/2000 |
| JP | 2011-214150 | 10/2011 |

OTHER PUBLICATIONS

Kobayashi et al "Decomposition characteristics of carbon dioxide by gas tunnel-type plasma jet" Vacuum 80 (2066) p. 1294-1298.*
Lou et al "Diamond formation by reduction of carbon dioxide at low temperature" J.Am Chem. Soc. (2003) 125, p. 9302-9303.*
Benson et al., "Electrocatalytic and Homogeneous Approaches to Conversion of CO2 to Liquid Fuels," Chemical Society Reviews, 2009, pp. 89-99, vol. 38.

(Continued)

*Primary Examiner* — Archene Turner
(74) *Attorney, Agent, or Firm* — Knobbe, Martens, Olson & Bear, LLP (57) ABSTRACT

Embodiments presented herein relate generally to the formation of diamond-like carbon, forms of diamond-like carbon and/or carbon dioxide fixation.

23 Claims, 5 Drawing Sheets

(56) References Cited

OTHER PUBLICATIONS

Diamond-Like Carbon (from Wikipedia), Information was available at website: http://en.wikipedia.org/wiki/Diamond-like_carbon, in some form no later than Jun. 20, 2011.

International Search Report and Written Opinion received in International Application No. PCT/CN2011/083138, dated Sep. 13, 2012, filed on Nov. 29, 2011.

Nonthermal Plasma (from Wikipedia), Information was available at website: http://en.wikipedia.org/wiki/Nonthermal_plasma, in some form no later than Jun. 20, 2011.

Wang Chen, et al., "Recent Progress in Diamond Synthesis," Physics, 2005, vol. 34 (3).

Spitsyn et al., "Diamond and Diamond-Like Films: Deposition from the Vapor Phase, Structure and Properties," Progress in Crystal Growth and Characterization, 1988, pp. 79-170, vol. 17 (2).

* cited by examiner

DIAMOND-LIKE CARBON

CLAIM FOR PRIORITY

This application is the U.S. national phase entry under 35 U.S.C. §371 of PCT/CN2011/083138, filed Nov. 29, 2011, the entire application of which is hereby incorporated by reference herein.

TECHNICAL FIELD

Embodiments presented herein relate generally to diamond-like carbon, methods of its formation, and/or use, and/or carbon dioxide fixation.

BACKGROUND

There are a variety of ways of making diamond-like carbon. Typically the process involves relatively extreme conditions involving high temperatures and/or pressure and/or vacuum.

SUMMARY

In some embodiments, a method of producing diamond-like carbon is provided. The method can include providing a volume of gas that includes carbon dioxide and performing a non-thermal plasma process on the carbon dioxide to produce diamond-like carbon.

In some embodiments, a method for fixation of carbon from carbon dioxide gas is provided. The method can include providing a volume of gas that includes carbon dioxide and performing a non-thermal plasma process to deposit at least some of the carbon dioxide on a conductive electrode, to fix the carbon dioxide.

In some embodiments, a method for reducing carbon dioxide from a volume of polluted gas is provided. The method can include providing a volume of polluted gas that includes carbon dioxide, providing at least one conductive (e.g., metal) structure, and removing at least part of the carbon dioxide by depositing the carbon dioxide as diamond-like carbon on the conductive (e.g., metal) structure. This can reduce carbon dioxide from the volume of polluted gas.

In some embodiments, a diamond-like carbon ("DLC") composition is provided. The composition can include a diamond-like carbon powder and at least one non-thermal plasma processed pollutant.

In some embodiments, a diamond-like carbon coated electrode is provided. The electrode can include at least one conductive (e.g., metal) electrode, a diamond-like carbon material deposited on the at least one electrode, and at least one pollutant deposited on the at least one electrode.

In some embodiments, an exhaust system is provided. The exhaust system can include an inlet for an exhaust gas, an outlet for the exhaust gas, and at least one chamber fluidly connected to the inlet and the outlet. In some embodiments, the chamber can be configured for generating a non-thermal plasma. In some embodiments, there is at least one electrode within the chamber by which the non-thermal plasma can be generated.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Provided herein are embodiments relating to diamond-like carbon. In some embodiments, provided herein are methods and/or devices that create diamond-like carbon through the use of a plasma, for example, by a non-thermal plasma process. In some embodiments, the creation of a diamond-like carbon itself can be desired. In some embodiments, the creation of the diamond-like carbon is a side-product of a method designed to achieve other results (such as $CO_2$ fixation and/or removal). In some embodiments these aspects can be combined into a single embodiment (e.g., allowing the useful production of carbon-like diamond while beneficially assisting the environment by reducing $CO_2$). Other embodiments with these and/or other uses and/or advantages are provided herein as well.

Figure 1:
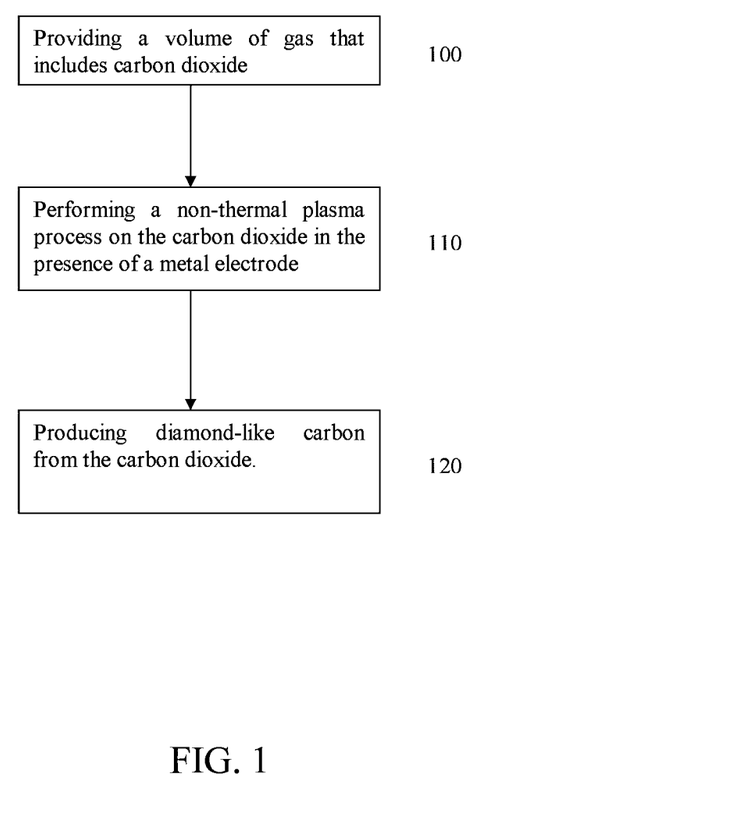
FIG. 1 shows an example of a flow chart depicting embodiments of methods of making diamond-like carbon.

FIG. 1 is a flow chart that outlines a general method of some embodiments for making diamond-like carbon. In some embodiments, one can provide a volume of gas that includes carbon dioxide (block 100). In some embodiments, one can perform a non-thermal plasma process on the carbon dioxide in the presence of a conductive (e.g., metal) electrode (block 110). In some embodiments, one can thereby produce diamond-like carbon from the carbon dioxide (120). In some embodiments, the diamond-like carbon is formed on the conductive (e.g., metal) electrode.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

In some embodiments, the method outlined above can be a method that is performed for producing diamond-like carbon. In some embodiments, this can include providing a volume of gas that includes carbon dioxide and performing a non-thermal plasma process on the carbon dioxide to produce diamond-like carbon.

In some embodiments, the method can be a method for the fixation of carbon from carbon dioxide gas. In some embodiments, the method can include providing a volume of gas including carbon dioxide, and performing a non-thermal plasma process to deposit at least some of the carbon dioxide on a conductive (e.g., metal) electrode to fix the carbon dioxide in a solid form.

In some embodiments, the method can be a method for reducing carbon dioxide from a volume of polluted gas. In some embodiments, the method can include providing a volume of polluted gas that includes carbon dioxide, providing at least one conductive (e.g., metal) structure, and removing at least part of the carbon dioxide from the volume of polluted gas by depositing the carbon dioxide as diamond-like carbon on the conductive (e.g., metal) structure. In some embodiments this can thereby reduce carbon dioxide from the volume of polluted gas. In some embodiments, $CH_4$, $C_2H_2$, etc. can also be present in the source gas for the non-thermal plasma. In some embodiments, these organic materials are not present in amounts that are sufficient for the formation or maintenance of a hydrogen based plasma species.

In some embodiments, one or more of the above goals can be achieved at the same time, at overlapping times, and/or by the same process. For example, in some embodiments, some methods provided herein allow for the beneficial creation of diamond-like carbon while reducing and/or removing $CO_2$ from the atmosphere and/or a volume of polluted gas. In some embodiments, the device and/or methods can be employed for other purposes and none of the above goals need be achieved.

In some embodiments, a $CO_2$ level in an initial volume of gas (which is subsequently treated by the non-thermal plasma process) can be reduced by at least some extent from the process, e.g., at least about 0.1%, reduction in $CO_2$ level, e.g., 0.1, 0.2, 0.5, 1, 2, 3, 4, 5, 10, 20, 30, 40, 50, 60, 70, 80, 90, 95, 96, 97, 98, 99, 99.9, 99.99, or 100% reduction in $CO_2$, including any range above ally of the preceding values and ally range between any two of the preceding values.

In some embodiments, the non-thermal plasma process occurs at atmospheric pressure. In some embodiments, the pressure is greater than that used for plasma vapor deposition and/or chemical vapor deposition. In some embodiments, the pressure is greater than or equal to about $10^{-5}$ Torr, e.g., $10^{-4}$, $10^{-3}$, $10^{-2}$, $10^{-1}$, 1, 10, 100, 200, 300, 400, 500, 600, 700, 710, 720, 730, 740, 750, 760, 761, 770, 780, 790, 800, 810, 820, 830, 840, 850, 860, 870, 880, 890, or 900 Torr, including any range above any of the preceding values and ally range between any two of the preceding values. In some embodiments, the conversion of $CO_2$ to diamond-like carbon call occur at pressure levels beneath $10^{-5}$ Torr.

In some embodiments, the non-thermal plasma process is performed at room temperature. In some embodiments, the temperature is lower than that for plasma vapor deposition. In some embodiments, the temperature is lower than that for chemical vapor deposition. In some embodiments, the temperature is less than or equal to about 300 degrees Centigrade, e.g., 290, 280, 270, 260, 250, 240, 230, 220, 210, 200, 190, 180, 170, 160, 150, 140, 130, 120, 110, 100, 90, 80, 70, 60, 50, 40, 30, 29, 28, 27, 26, 25, 24, 23, 22, 21, 20, 19, 18, 17, 16, 15, 14, 13, 12, 11, 10, 9, 8, 7, 6, 5, 4, 3, 2, 1, or lower, including ally range beneath ally of the preceding values and ally range between ally two of the preceding values. In some embodiments, the non-thermal plasma process is performed at a temperature of 10 degrees Centigrade to 300 degrees Centigrade. In some embodiments, the non-thermal plasma process is performed at a temperature of 17 degrees Centigrade to 50 degrees Centigrade.

In some embodiments, ally of a variety of gases and/or gas sources can be used. In some embodiments, the gas or gas source includes carbon dioxide. In some embodiments, the volume of gas is essentially carbon dioxide. In some embodiments, the volume of gas includes and/or is from a polluted gas source and includes non-$CO_2$ gas and/or other contaminants. In some embodiments, the polluted volume of gas is obtained from all exhaust and/or is in fluid communication with all exhaust system, exhaust producing device or facility, and/or gas exhaust storage. In some embodiments, the polluted volume of gas is the exhaust from the burning, use, and/or processing of a fossil fuel. In some embodiments, the polluted volume of gas is any gas that includes $CO_2$ (as $CO_2$ can be a contaminant in some embodiments). In some embodiments, the fossil fuel is selected from at least one of gasoline, fuel oil, coal, or natural gas.

In some embodiments, the carbon dioxide within the volume of gas is an undesired pollutant within the volume of gas. In some embodiments, the carbon dioxide was not added to the volume of gas from a source of pure carbon dioxide. In some embodiments, the carbon dioxide was added to the volume of gas. In some embodiments, the volume of gas is essentially pure carbon dioxide. In some embodiments, the gas has been filtered so that undesired, non-carbon dioxide contaminants have been removed and/or reduced. In some embodiments, the volume of gas includes $CO_2$ in at least some amount, e.g., at least about 1% $CO_2$, e.g., 1, 5, 10, 20, 25, 30, 35, 40, 45, 50, 51, 52, 53, 54, 55, 60, 65, 70, 75, 80, 85, 90, 91, 92, 93, 94, 95, 96, 97, 98, 99, 99.9, 99.99, 99.999, or 100%, including any range greater than any of the preceding values and any range between any two of the preceding values.

In some embodiments, a thermal plasma process and/or chamber is used and $CO_2$ (and/or hydrocarbons such as $CH_4$/$C_2H_2$) is used as the source gas.

In some embodiments, the gas has an amount of hydrogen (such as $H_2$) that is less than or equal to about 99% of the volume of gas, e.g., 98, 95, 90, 85, 80, 79, 78, 77, 76, 75, 74, 73, 72, 71, 70, 65, 60, 55, 50, 45, 40, 35, 30, 25, 20, 15, 10, 9, 8, 7, 6, 5, 4, 3, 2, 1, 0.9, 0.8, 0.7, 0.6, 0.5, 0.4, 0.3, 0.2, or 0.1% or less of the plasma source gas is hydrogen based (such as $H_2$) (including any range beneath any one of the preceding values). In some embodiments, the gas used contains essentially no hydrogen. In some embodiments, the gas contains no hydrogen. In some embodiments, the amount of hydrogen present is not sufficient to maintain a hydrogen-based plasma. In some embodiments, no hydrogen has been added to the gas in order to perform the plasma based process.

In some embodiments, the use of $CO_2$ gas as a precursor for diamond-like carbon, and/or avoiding the use of $H_2$ as a source gas for the plasma can provide more available carbon to a plasma. In some embodiments, this can increase the deposition rate. In some embodiments, the deposition rate can be increased by 2, 3, 4, 5, 6, 7, 8, 9, 10, 11, 12 fold or more. In some embodiments, the process allows deposition rates of about 0.1 micron/minute or greater, e.g., 0.1, 0.2, 0.3, 0.4, 0.5 or greater microns/minute. In some embodiments, the deposition can occur at room temperature. In some embodiments, one or more of the above allows one to avoid heating the substrate, which can remain at room temperature or a temperature that is less than or equal to about 300 degrees Centigrade, e.g., 290, 280, 270, 260, 250, 240, 230, 220, 210, 200, 190, 180, 170, 160, 150, 140, 130, 120, 110, 100, 90, 80, 70, 60, 50, 40, 30, 29, 28, 27, 26, 25, 24, 23, 22, 21, 20, 19, 18, 17, 16, 15, 14, 13, 12, 11, 10, or lower. In some embodiments, one or more of the above allows for lower and/or reduced energy consumption and/or cost for creation of diamond-like carbon and/or $CO_2$ fixation and/or removal.

In some embodiments, the $CO_2$ level in an initial volume of gas (which is subsequently treated by the non-thermal plasma process) can be reduced by some extent from the process, e.g., at least about 0.1, 0.2, 0.5, 1, 2, 3, 4, 5, 10, 20, 30, 40, 50, 60, 70, 80, 90, 95, 96, 97, 98, 99, 99.9, 99.99, or 100% reduction in $CO_2$, including any range above any of the preceding values and any range between any two of the preceding values.

In some embodiments, the volume of gas includes at least one of nitrogen, carbon monoxide, argon, helium, or a hydrocarbon, and/or other inert gases.

The process conditions for the plasma process can occur under a number of conditions, depending upon the end results desired, as appreciated by one of skill in the art, given the present disclosure. In some embodiments, the plasma process is performed with a power source at an input voltage of about 10 V to about 200 V, e.g., 10, 20, 30, 40, 50, 60, 70, 80, 90, 100, 110, 120, 130, 140, 150, 160, 170, 180, 190, or 200V, including ranges defined between any two of the preceding values. In some embodiments, lower voltages can be used, and in some embodiments greater voltages can be used. In some embodiments, the plasma process is performed at a frequency of about 50 Hz to about 1000 Hz, e.g., 50, 100, 200, 300, 400, 500, 600, 700, 800, 900, or 1000 Hz, including ranges defined between any two of the preceding values. In some embodiments, greater voltages can be used. In some embodiments, lower voltages can be used.

The processing can occur for a variety of durations, depending upon a number of variables and desired outcomes. In some embodiments, the plasma process occurs for about 1 or more seconds, e.g., 1 second, 2 seconds, 3 seconds, 4 seconds, 5 seconds, 6 seconds, 7 seconds, 8 seconds, 9 seconds, 10 seconds, 20 seconds, 30 seconds, 40 seconds, 50 seconds, 1 minute, 2 minutes, 5 minutes, 10 minutes, 20 minutes, 30 minutes, 1 hour, 2 hours, 5 hours, or longer, including any range between any two of the preceding values and any range above any one of the preceding values. In some embodiments, the gas is kept in a chamber during this period. In some embodiments, the plasma process occurs during this period. In some embodiments, the plasma process can occur along a flow path of the gas. In some embodiments the plasma discharge is during this period. In some embodiments, the gas is held for the above period.

In some embodiments, the process can be combined with other processes, such as filtering, concentrating, and/or purifying the initial $CO_2$ gas.

In some embodiments, the process does not involve physical vapor deposition, chemical vapor deposition, or electrochemical liquid deposition. In some embodiments, the process does further involve physical vapor deposition, chemical vapor deposition, or electrochemical liquid deposition. In some embodiments, the method does not involve electrochemical vapor deposition. In some embodiments, the process does not involve condensing ion beams or ionic deposition. In some embodiments, the process does involve condensing ion beams or ionic deposition, where $CO_2$ is used as a source of the carbon in the diamond-like carbon.

In some embodiments, there can be other materials in the source gas (e.g., apart from carbon dioxide). In some embodiments, a source of pure and/or essentially pure $CO_2$ can be used. In some embodiments, a refilled or purified source of $CO_2$ can be used.

In some embodiments, at least 1% of the carbon in the diamond-like carbon is from the carbon dioxide in the initial source gas, e.g., at least about 1, 2, 5, 10, 20, 30, 40, 50, 60, 70, 80, 90, 91, 92, 93, 94, 95, 96, 97, 98, 99, 99.9, 99.99, or 100% of the carbon in the diamond-like carbon is from the carbon dioxide, including any range above any of the preceding values, and any range between any two of the preceding values.

In some embodiments, the diamond-like carbon can be created in a plasma chamber. In some embodiments, the diamond-like carbon can be created in a non-thermal plasma chamber. In some embodiments, the diamond-like carbon is produced on at least one conductive (e.g., metal) electrode. In some embodiments, the electrode can be made of a metal. In some embodiments, the diamond-like carbon is produced on the electrode and/or a conductive (e.g., metal) structure. In some embodiments, the electrode and/or conductive (e.g., metal) structure can have any shape. In some embodiments, the electrode and/or conductive (e.g., metal) structure has a shape of a mesh, a foil, a wire, a rod, a plate, a ring, etc.

In some embodiments, further processing of the diamond-like carbon can be performed after the diamond-like carbon is created. In some embodiments, it can be scrapped or physically removed from the electrode. In some embodiments, the diamond-like carbon can be powdered. In some embodiments, the diamond-like carbon can be used as a starting material for other processes.

In some embodiments, any type of non-thermal plasma can be employed. In some embodiments, the non-thermal plasma can be a remote treatment (e.g., employing decaying plasma, e.g., remote exposure reactor and/or plasma pencil), a direct treatment (e.g., gliding arc, plasma needle, and/or microwave induced plasma), and/or involve electrode contact (parallel plate reactor, needle-plate reactor, resistive barrier discharge, and/or dielectric barrier discharge).

In some embodiments, the non-thermal plasma does not require the substrate to be heated, does not require the chamber to be heated, and/or operates at near atmospheric pressure.

Figure 2:
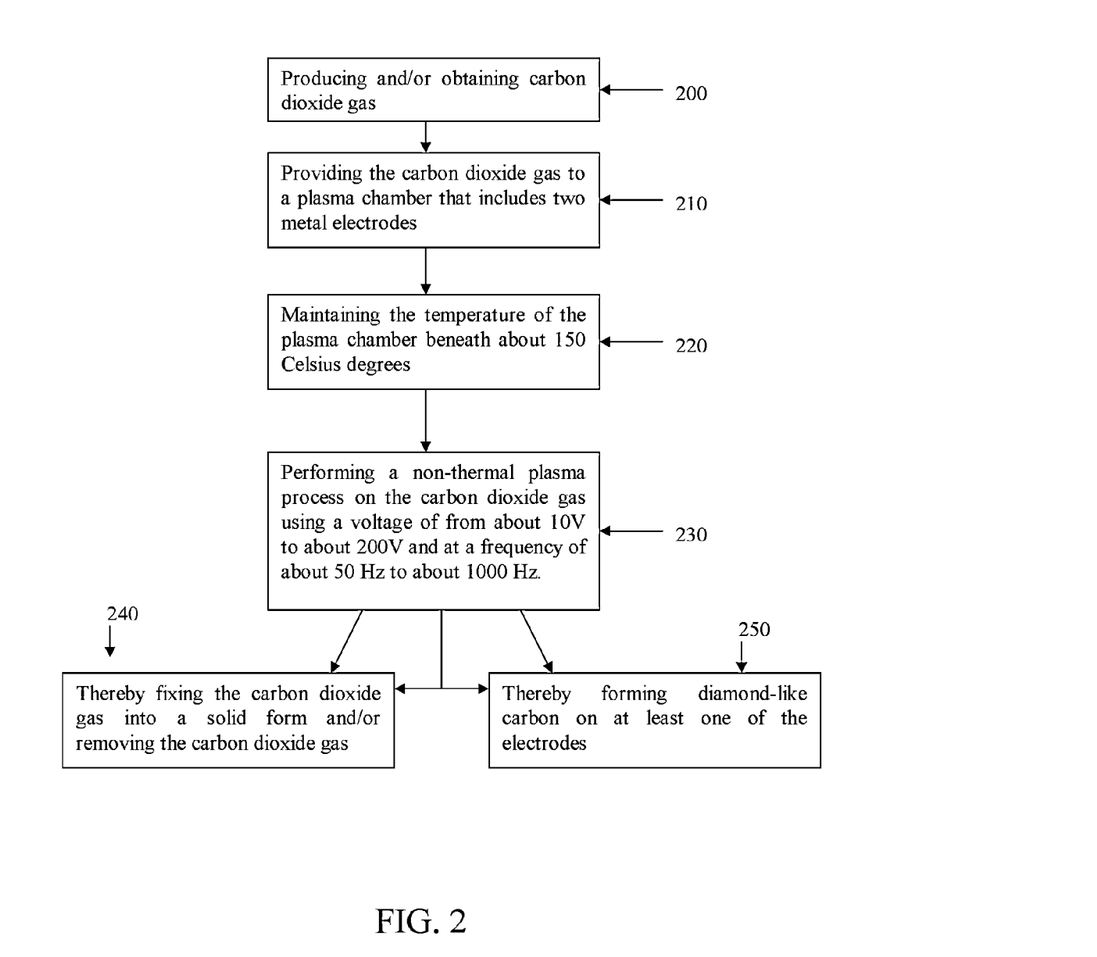
FIG. 2 shows an example of a flow chart depicting embodiments of methods of making diamond-like carbon.

FIG. 2 depicts another set of embodiments of various methods for producing diamond-like carbon. In some embodiments, one can produce and/or obtain carbon dioxide gas (block 200). In some embodiments, one can provide the carbon dioxide gas to a plasma chamber that includes two conductive (e.g., metal) electrodes (block 210). In some embodiments, one can maintain the temperature of the plasma chamber beneath about 150 degrees Centigrade (block 220). In some embodiments, one performs a non-thermal plasma process on the carbon dioxide gas using a power source with an input voltage of from about 10V to about 200 V at a frequency of about 50 Hz to about 1000 Hz (block 230). In some embodiments, the result can be fixing the carbon dioxide gas into a solid form and/or removing the carbon dioxide gas (block 240) and/or forming diamond-like carbon on at least one of the electrodes (block 250).

Figure 3:
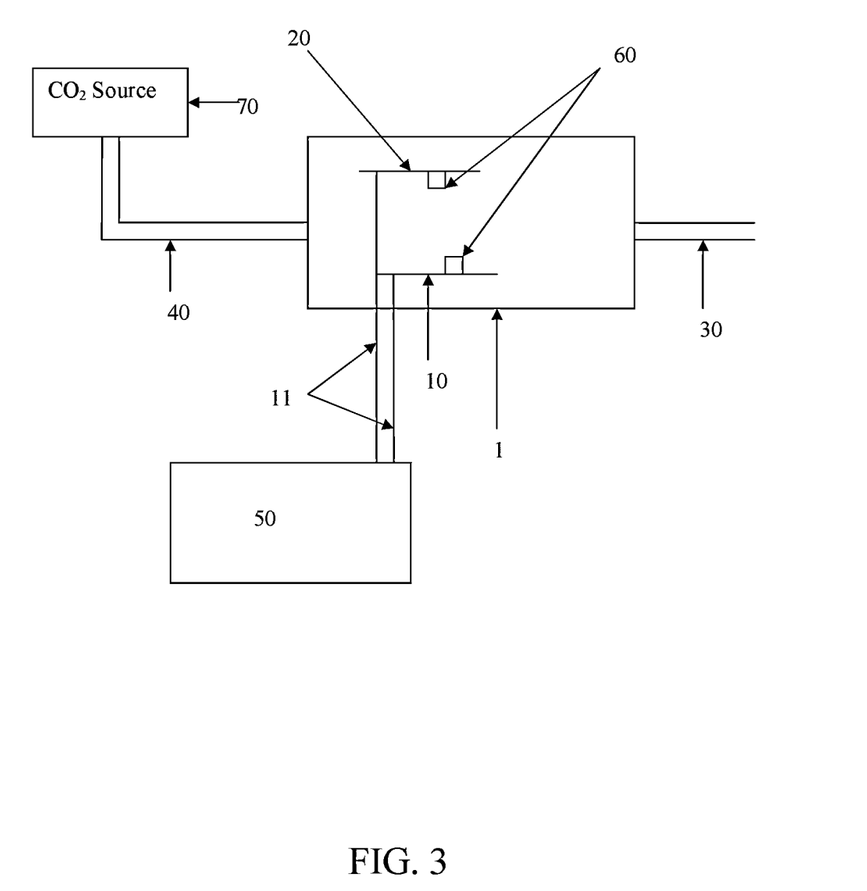
FIG. 3 is a schematic of an embodiment of a device for making diamond-like carbon.

FIG. 3 depicts some embodiments of possible arrangements of devices that can be used to prepare diamond-like carbon. In some embodiments, a plasma chamber 1 is provided. The chamber can be a non-thermal plasma chamber in some embodiments. In some embodiments, the chamber can include one or more electrodes. In some embodiments, the chamber includes a first electrode 10 and a second electrode 20. In some embodiments, at least one of the first and second electrodes 10 and 20 can be in electrical communication with a controller 50, which can be in communication with a power source for the plasma chamber, via electrical leads 11. In some embodiments, the chamber 1 is in fluid communication with an intake line 40 and an output line 30. In some embodiments, the chamber can be sealed so as to allow for the more efficient creation of the plasma. In some embodiments, the processing occurs under generally atmospheric conditions. In some embodiments, the intake line 40 is in fluid communication with a source of $CO_2$ 70. In some embodiments, the chamber includes a device for generating a magnetic field and/or a cooling system. In some embodiments, the system is set up so as to allow the remote generation of the plasma.

In some embodiments, the $CO_2$ source can be a tank of $CO_2$. In some embodiments, the $CO_2$ source can be a pressurized tank of waste and/or exhaust gas that has a pressure above standard atmospheric pressure. In some embodiments, the $CO_2$ source can be an exhaust system, e.g., from a vehicle, factory, processing plant, generator, etc. There need be no limit on the types of $CO_2$ sources that can be employed.

In some embodiments, the electrodes (10 and 20) can be made out of metal. In some embodiments, the electrodes can be made of at least one of aluminum, titanium, stainless steel, silicon, diamond, metal alloy or combinations thereof. In some embodiments, the electrodes can be a combination of silicon, diamond, and/or metal alloy. In some embodiments, more than 2 electrodes can be used in a chamber. While the term "electrode" is used herein, one of skill in the art will appreciate that a device or structure onto which the diamond-like carbon is desired to be placed can also be used as the "electrode", so that the deposition occurs directly onto the desired object to be coated with the diamond-like carbon. Thus, the disclosure presented herein in regard to electrodes also applies to objects that are to be coated and/or can also serve as electrodes (when in the proper arrangement).

In some embodiments, the electrodes are removable from the chamber, so as to allow easier access to remove any diamond-like carbon that has been produced. In some embodiments, one or more of the electrodes include a surface that allows for greater amounts of diamond-like carbon to accumulate. In some embodiments, one or more of the electrodes has a surface area that is configured so as to allow greater accumulation of the diamond-like carbon. In some embodiments, the chamber includes a device configured for removing built up carbon-like diamond from one or more of the electrodes. In some embodiments, this can include, for example, a grinding mechanism, a scraping mechanism, or other device.

In some embodiments, a diamond-like carbon coated electrode (or other device or structure) is provided. In some embodiments, the electrode can include at least one conductive (e.g., metal) electrode, a diamond-like carbon material deposited on the at least one electrode, and at least one pollutant deposited on the at least one electrode. In some embodiments, the surface of the electrode can also include contaminants from a processed exhaust based source gas (such as sulfur and nitrogen based derivatives). In some embodiments, the diamond-like carbon is deposited as a film on the at least one electrode. In some embodiments, the diamond-like carbon is amorphous.

In some embodiments, at least one electrode (or other device or structure) is within a non-thermal plasma chamber. In some embodiments, the at least one electrode (or other device or structure) includes a metal, such as aluminum, titanium, stainless steel, silicon, diamond, metal alloy, or combinations thereof. In embodiments in which the diamond-like carbon is to be directly deposited onto a device or structure, the chamber can include electrical leads so as to connect the other device or structure to a source of electricity so that it can serve as an electrode (and thus have the diamond-like carbon directly deposited onto it). In some embodiments, the at least one electrode is a conducting object that is to be coated with a diamond-like carbon coating.

In some embodiments, the item to be coated with the diamond-like coating can have a relatively low melting point and/or be sensitive to pressure. In some embodiments the object can be directly coated during the plasma processing of the $CO_2$; and thus, can be stable under such conditions. For example, the object may have a melting or decomposition point above room temperature or at a lower atmospheric value. For example, in some embodiments, the object can have a melting point at 300, 290, 280, 270, 260, 250, 240, 230, 220, 210, 200, 190, 180, 170, 160, 150, 140, 130, 120, 110, 100, 90, 80, 70, 60, 50, 40, 30, 29, 28, 27, 26, 25, 24, or 23 degrees Centigrade or higher. In some embodiments, the object can be subject to damage at atmospheric pressures of less than standard atmospheric pressure, e.g., $10^{-5}$ Torr, e.g., $10^{-4}$, $10^{-3}$, $10^{-2}$, $10^{-1}$, 1, 10, 100, 200, 300, 400, 500, 600, 700, 710, 720, 730, 740, 750, or 760 Torr, or ally range of values less than any one of the preceding values.

In some embodiments, a diamond-like carbon composition is provided. In some embodiments, the diamond-like carbon composition includes a diamond-like powder and at least one non-thermal plasma processed pollutant. In some embodiments, the composition can include derivatives that have resulted from exhaust impurities present during a non-thermal plasma treatment of an exhaust gas. In some embodiments, no impurities are present in the diamond-like carbon composition. In some embodiments, carbonyl groups can be present in the composition. In some embodiments. SOx and/or NOx derivatives can be present. In some embodiments, the SOx and/or NOx derivatives are SOx and/or NOx compounds that have undergone non-thermal plasma processing in the presence of at least $CO_2$. In some embodiments, there is no processed pollutant present in the composition (apart from the processed $CO_2$).

In some embodiments, the produced diamond-like carbon resembles diamond in one or more of its performance characteristics. In some embodiments, the diamond-like carbon has at least one of the following: high abrasion resistance, low friction coefficient, thermal stability, desirable optical characteristics, high resistance, or desirable biocompatibilities. In some embodiments, the diamond-like carbon from $CO_2$ is as good or is superior in any one or more of the above characteristics compared to traditional diamond-like carbon products (e.g., from hydrogen-source carbon coatings). In some embodiments, the diamond-like carbon has lower characteristics in one or more of the above characteristics compared to traditional diamond-like carbon products.

In some embodiments, the diamond-like carbon can be used for any number of uses. In some embodiments, the diamond-like carbon can be used in one or more of: anti-abrasive coatings, magnetic medium protective layer, optical protective coatings, high frequency loudspeaker diaphragms, heart valve prosthesis etc. In some embodiments, the diamond-like carbon coating can be applied directly to the device or part to be coated, via the use of the device or part as an electrode (when this is appropriate). In some embodiments, the diamond-like carbon can be applied in other manners. In some embodiments, the diamond-like-carbon can have a diameter of from about 0.01 micron to about 1000 microns, e.g., 0.01, 0.1, 0.2, 0.5, 1, 2, 3, 4, 5, 10, 20, 30, 40, 50, 60, 70, 80, 90, 100, 200, 300, 400, 500, 600, 700, 800, 900, 1000 microns or larger.

In some embodiments, an exhaust system that can reduce $CO_2$, fix $CO_2$, and/or produce diamond-like carbon is provided. In some embodiments, this includes an inlet for an exhaust gas, an outlet for the exhaust gas, and at least one chamber fluidly connected to the inlet and the outlet. In some embodiments, the chamber is configured for generating a non-thermal plasma. In some embodiments, there is at least one electrode within the chamber by which the non-thermal plasma can be generated. In some embodiments, the chamber can be part of a device through which exhaust already flows. In some embodiments, the chamber and/or inlet includes an adaptor or threaded section so as to allow the device to be connected to a gas outlet. In some embodiments, the system includes one or more filters located before the chamber, so as to remove and/or reduce particulates passing into the inlet. In some embodiments, the system can simply include non-thermal plasma capable electrodes, which can be placed into any closed or effectively enclosable volume, thereby turning the volume into a non-thermal plasma chamber, in which one or more of the above methods can be performed.

Example 1

Production of Diamond-Like Carbon from Carbon Dioxide

The present example outlines a method of preparing diamond-like carbon from carbon dioxide. Carbon dioxide was pumped into a non-thermal plasma chamber at atmospheric pressure. A non-thermal plasma was created in the chamber, which coated an electrode in the chamber with an amount of diamond-like carbon. The input voltage was 200V with 800 Hz frequency, and a 0.75 A current. Pure $CO_2$ was flowed into the chamber as gas source and the electrode was a Ti wire. The deposition was processed for about 0.5 hour. The experiment was conducted at room temperature and at atmospheric pressure.

Figure 4:
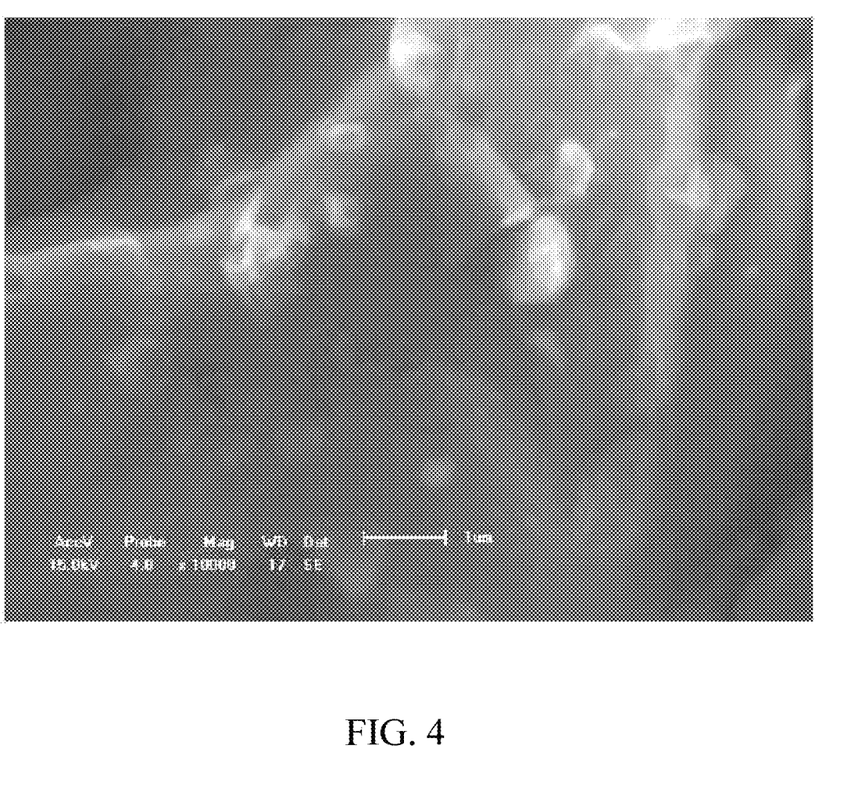
FIG. 4 is a scanning electronic micrograph of some embodiments of resulting diamond-like carbon.
Figure 5:
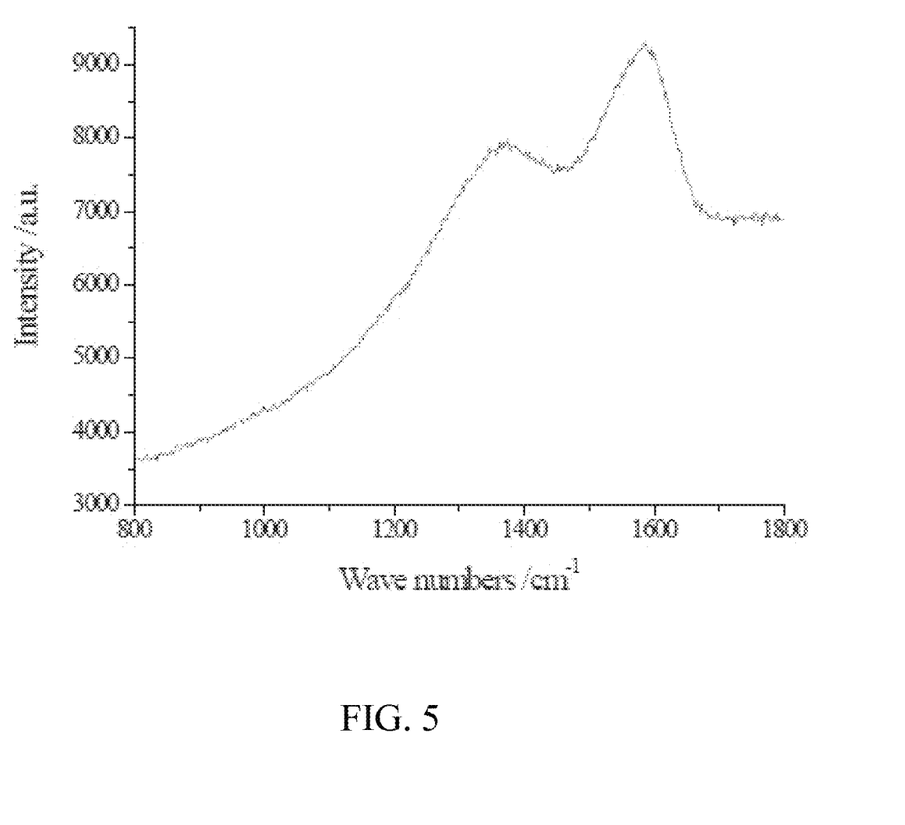
FIG. 5 is a graph depicting the Raman spectrum of some embodiments of diamond-like carbon deposited on an electrode.

The electrode was examined under scanning electron microscope (FIG. 4) to verify that diamond-like carbon was created. The particles of diamond-like carbon were on the micron scale in size and were irregular in shape. A Raman analysis was also conducted on the material (results shown in FIG. 5), which demonstrated peaks at 1550 $cm^{-1}$ and 1360 $cm^{-1}$, corresponding to diamond-like carbon G peak and D peak respectively, confirming that the product was indeed diamond-like carbon.

Example 2

Production of Diamond-Like Carbon from Exhaust Gases

One first obtains carbon dioxide gas contained within an exhaust gas from a factory that is employing a fossil fuel. The exhaust gas is pumped into a non-thermal plasma chamber that includes two metal electrodes. One maintains the temperature of the plasma chamber at room temperature and creates plasma at 50V, 200 Hz, for 10 seconds. This plasma process will produce diamond-like carbon from the exhaust gas on an electrode.

Example 3

Reduction of Carbon Dioxide Emissions

A non-thermal plasma-processing chamber is attached to the end of an exhaust system. Carbon dioxide gas that passes out of the exhaust system is subject to a non-thermal plasma treatment at 70 degrees centigrade using a voltage of from about 12V at a frequency of about 60 Hz for at least 5 seconds. This will result in at least some of the carbon dioxide in the system being associated with the electrodes in the plasma chamber, thereby reducing the carbon dioxide emissions of the system.

Example 4

Fixation of Carbon Dioxide

Carbon dioxide is collected. It will be processed under non-thermal plasma processing conditions at room temperatures, at 100V at 500 Hz for 30 seconds. The carbon dioxide will be transformed by the plasma process into diamond-like carbon on an electrode within a plasma chamber. This will effectively fix the carbon dioxide onto the electrodes in a solid form and remove it from the atmosphere.

Example 5

Production of Diamond-Like Powder

A powder form of the diamond-like carbon can be formed by taking the product, for example of Example 1, and then separating the produced diamond-like carbon from the electrode. The product can then be further ground so as to make a powder form of diamond-like carbon.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases at least one and "one or more" to introduce claim recitations. However, the use of such phrases should not be construed to imply that the introduction of a claim recitation by the indefinite articles "a" or an limits any particular claim containing such introduced claim recitation to embodiments containing only one such recitation, even when the same claim includes the introductory phrases "one or more" or at least one and indefinite articles such as "a" or an (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of producing diamond-like carbon, the method comprising:
   providing a volume of gas comprising carbon dioxide; and
   performing a non-thermal plasma process on the carbon dioxide to produce diamond-like carbon, wherein the plasma process is performed with an input voltage of 10-200V, a frequency of 50-1000 Hz, and at a temperature of 17-50° C.

2. The method of claim 1, wherein the volume of gas comprises a polluted volume of gas.

3. The method of claim 2, wherein the polluted volume of gas is obtained from an exhaust.

4. The method of claim 2, wherein the polluted volume of gas is an exhaust from burning a fossil fuel.

5. The method of claim 1, wherein the carbon dioxide within the volume of gas is an undesired pollutant within the volume of gas.

6. The method of claim 1, wherein the carbon dioxide was not added to the volume of gas from a source of pure carbon dioxide.

7. The method of claim 1, wherein the non-thermal plasma process does not involve physical vapor deposition, chemical vapor deposition, or electrochemical liquid deposition.

8. The method of claim 1, wherein the diamond-like carbon is produced on a metal electrode.

9. The method of claim 8, wherein the metal electrode comprises at least one of silicon, metal alloy, and diamond.

10. A method for fixation of carbon from carbon dioxide gas, the method comprising:
    providing a volume of gas comprising carbon dioxide; and
    performing a non-thermal plasma process to deposit at least some of the carbon dioxide on an electrode, thereby fixing carbon dioxide.

11. The method of claim 10, wherein the non-thermal plasma process occurs at atmospheric pressure.

12. The method of claim 10, wherein the non-thermal plasma process is performed at a temperature of 17 degrees Centigrade to 50 degrees Centigrade.

13. The method of claim 10, wherein the volume of gas consists essentially of carbon dioxide.

14. The method of claim 10, wherein the non-thermal plasma process occurs at a temperature of equal to or less than 150 degrees Centigrade.

15. The method of claim 10, wherein the non-thermal plasma process occurs at a pressure of equal to or higher than 100 Torr.

16. A method for reducing carbon dioxide from a volume of polluted gas, the method comprising:
    providing a volume of polluted gas that comprises carbon dioxide;
    providing at least one conductive structure; and
    removing at least part of the carbon dioxide by depositing the carbon dioxide as diamond-like carbon on the conductive structure, thereby reducing carbon dioxide from the volume of polluted gas.

17. The method of claim 16, wherein the diamond-like carbon is produced on the conductive structure.

18. The method of claim 16, wherein the conductive structure has a shape of at least one of mesh, foil, or wire.

19. A diamond-like carbon (DLC) composition comprising:
    diamond-like carbon powder and at least one non-thermal plasma processed pollutant.

20. A diamond-like carbon (DLC) coated electrode, the electrode comprising:
- at least one conductive electrode;
- a diamond-like carbon material deposited on the at least one electrode; and
- at least one pollutant deposited on the at least one electrode.

21. The method of claim 20, wherein the electrode comprises at least one of silicon, metal alloy, and diamond.

22. The composition of claim 20, wherein the pollutant is at least one of a compound comprising a carbonyl group, a SOx or a NOx.

23. An exhaust system comprising:
- an inlet for an exhaust gas;
- an outlet for the exhaust gas;
- at least one chamber fluidly connected to the inlet and the outlet, wherein the chamber is configured for generating a non-thermal plasma; and
- at least one electrode within the chamber by which the non-thermal plasma can be generated.

* * * * *

UNITED STATES PATENT AND TRADEMARK OFFICE
CERTIFICATE OF CORRECTION

PATENT NO. : 9,034,468 B2
APPLICATION NO. : 13/884603
DATED : May 19, 2015
INVENTOR(S) : Wang et al.

It is certified that error appears in the above-identified patent and that said Letters Patent is hereby corrected as shown below:

In the specification

In Column 1, Line 6, delete "U.S.C. §371" and insert -- U.S.C. § 371 --, therefor.

In Column 3, Line 40, delete "ally of the preceding values and ally" and insert -- any of the preceding values and any --, therefor.

In Column 3, Line 50, delete "ally range" and insert -- any range --, therefor.

In Column 3, Line 52, delete "call" and insert -- can --, therefor.

In Column 3, Lines 64-65, delete "ally range beneath ally of the preceding values and ally range between ally two" and insert -- any range beneath any of the preceding values and any range between any two --, therefor.

In Column 4, Line 4, delete "ally of" and insert -- any of --, therefor.

In Column 4, Line 11, delete "all exhaust" and insert -- an exhaust --, therefor.

In Column 4, Line 12, delete "all exhaust" and insert -- an exhaust --, therefor.

In Column 4, Line 27, delete "undesired," and insert -- undesired --, therefor.

In Column 5, Line 66, delete "refilled" and insert -- refined --, therefor.

In Column 8, Line 18, delete "ally range" and insert -- any range --, therefor.

In Column 8, Line 29, delete "embodiments. SOx" and insert -- embodiments, SOx --, therefor.

Signed and Sealed this
Twentieth Day of October, 2015

Michelle K. Lee
*Director of the United States Patent and Trademark Office*

CERTIFICATE OF CORRECTION (continued)
U.S. Pat. No. 9,034,468 B2

In the specification

In Column 8, Line 59, delete "diamond-like-carbon" and insert -- diamond-like carbon --, therefor.

In Column 10, Lines 62-63, delete "at least one and" and insert -- "at least one" and --, therefor.

In Column 10, Line 66, delete "an limits" and insert -- "an" limits --, therefor.

In Column 11, Line 2, delete "at least one and" and insert -- "at least one" and --, therefor.

In Column 11, Line 3, delete "or an" and insert -- or "an" --, therefor.